United States Patent
Cargill

(10) Patent No.: US 10,375,483 B2
(45) Date of Patent: Aug. 6, 2019

(54) MEMS DEVICE AND PROCESS

(71) Applicant: Cirrus Logic International Semiconductor Ltd., Edinburgh (GB)

(72) Inventor: Scott Lyall Cargill, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/636,019

(22) Filed: Jun. 28, 2017

(65) Prior Publication Data

US 2018/0007473 A1    Jan. 4, 2018

(30) Foreign Application Priority Data

Jun. 30, 2016    (GB) .................................. 1611382.1
Jun. 30, 2016    (WO) ................ PCT/GB2016/051975

(51) Int. Cl.
| | |
|---|---|
| *H04R 19/04* | (2006.01) |
| *B81B 3/00* | (2006.01) |
| *B81C 1/00* | (2006.01) |
| *B81B 7/00* | (2006.01) |
| *H04R 7/18* | (2006.01) |
| *H04R 19/00* | (2006.01) |

(52) U.S. Cl.
CPC ........... *H04R 19/04* (2013.01); *B81B 3/0027* (2013.01); *B81B 3/0072* (2013.01); *B81B 7/0016* (2013.01); *B81C 1/00666* (2013.01); *B81B 2201/0257* (2013.01); *B81B 2203/0127* (2013.01); *B81B 2203/0315* (2013.01); *H04R 7/18* (2013.01); *H04R 19/005* (2013.01); *H04R 2201/003* (2013.01); *H04R 2499/11* (2013.01)

(58) Field of Classification Search
CPC ............ H04R 19/005; H04R 2201/003; H04R 2499/11
See application file for complete search history.

(56) References Cited

U.S. PATENT DOCUMENTS

| | | | |
|---|---|---|---|
| 8,942,394 B2 * | 1/2015 | Conti ...................... | H04R 7/24 381/174 |
| 8,987,844 B2 * | 3/2015 | Jenkins ................. | B81B 3/0021 257/416 |
| 9,002,037 B2 * | 4/2015 | Dehe ..................... | B81B 7/0029 381/113 |
| 9,002,039 B2 * | 4/2015 | Zhang ................... | H04R 1/222 381/174 |

(Continued)

FOREIGN PATENT DOCUMENTS

| | | |
|---|---|---|
| WO | 2016120213 A1 | 8/2016 |
| WO | 2016120214 A1 | 8/2016 |

OTHER PUBLICATIONS

International Search Report and Written Opinion of the International Search Authority, International Application No. PCT/GB2016/051975, dated Mar. 17, 2017.

(Continued)

*Primary Examiner* — Curtis A Kuntz
*Assistant Examiner* — Ryan Robinson
(74) *Attorney, Agent, or Firm* — Jackson Walker L.L.P.

(57) ABSTRACT

The application describes MEMS transducers comprising a flexible membrane supported at a supporting edge relative to a substrate and further comprising one or more unbound edges. The shape of the unbound edge is selected so that the flexible membrane tends to bend along more than one bend axis in the region of the supporting edge.

21 Claims, 6 Drawing Sheets

(56) References Cited

U.S. PATENT DOCUMENTS

| | | | |
|---|---|---|---|
| 9,078,068 B2* | 7/2015 | Langlois | H04R 1/222 |
| 9,227,843 B2* | 1/2016 | Dehe | B81B 3/007 |
| 9,681,243 B2* | 6/2017 | Guo | B81B 3/0051 |
| 9,936,298 B2* | 4/2018 | Buck | H04R 7/14 |
| 2015/0014796 A1 | 1/2015 | Debe | |
| 2015/0078592 A1* | 3/2015 | Uchida | H04R 19/04 |
| | | | 381/191 |
| 2015/0207435 A1 | 7/2015 | Rombach | |
| 2015/0369653 A1 | 12/2015 | Inoue | |
| 2016/0021459 A1 | 1/2016 | Inoue et al. | |
| 2016/0037266 A1* | 2/2016 | Uchida | H04R 7/06 |
| | | | 381/71.8 |
| 2016/0088400 A1 | 3/2016 | Yoo et al. | |

OTHER PUBLICATIONS

Combined Search and Examination Report under Sections 17 and 18(3), Application No. GB1611382.1, dated Sep. 15, 2016.
Examination Opinion, Taiwan Intellectual Property Office, TW Application No. 106120249, dated Sep. 19, 2018.
Rejection Decision, Taiwan Intellectual Property Office, TW Application No. 106120249, dated Jan. 2019.

* cited by examiner

# MEMS DEVICE AND PROCESS

FIELD OF DISCLOSURE

This invention relates to a micro-electro-mechanical system (MEMS) device and process, and in particular to a MEMS device and process relating to a transducer, for example a capacitive microphone.

BACKGROUND

Various MEMS devices are becoming increasingly popular. MEMS transducers, and especially MEMS capacitive microphones, are increasingly being used in portable electronic devices such as mobile telephones and portable computing devices.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between a pair of electrodes which will vary as the distance between the electrodes changes in response to sound waves incident on the membrane surface.

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

The first cavity 109 may be formed using a first sacrificial layer during the fabrication process, i.e. using a material to define the first cavity which can subsequently be removed, and depositing the membrane layer 101 over the first sacrificial material. Formation of the first cavity 109 using a sacrificial layer means that the etching of the substrate cavity 108 does not play any part in defining the diameter of the membrane. Instead, the diameter of the membrane is defined by the diameter of the first cavity 109 (which in turn is defined by the diameter of the first sacrificial layer) in combination with the diameter of the second cavity 110 (which in turn may be defined by the diameter of a second sacrificial layer). The diameter of the first cavity 109 formed using the first sacrificial layer can be controlled more accurately than the diameter of a back-etch process performed using a wet-etch or a dry-etch. Etching the substrate cavity 108 will therefore define an opening in the surface of the substrate underlying the membrane 101.

A plurality of holes, hereinafter referred to as bleed holes 111, connect the first cavity 109 and the second cavity 110.

As mentioned the membrane may be formed by depositing at least one membrane layer 101 over a first sacrificial material. In this way the material of the membrane layer(s) may extend into the supporting structure, i.e. the side walls, supporting the membrane. The membrane and back-plate layer may be formed from substantially the same material as one another, for instance both the membrane and back-plate may be formed by depositing silicon nitride layers. The membrane layer may be dimensioned to have the required flexibility whereas the back-plate may be deposited to be a thicker and therefore more rigid structure. Additionally various other material layers could be used in forming the back-plate 104 to control the properties thereof. The use of a silicon nitride material system is advantageous in many ways, although other materials may be used, for instance MEMS transducers using polysilicon membranes are known.

In some applications, the microphone may be arranged in use such that incident sound is received via the back-plate. In such instances a further plurality of holes, hereinafter referred to as acoustic holes 112, are arranged in the back-plate 104 so as to allow free movement of air molecules, such that the sound waves can enter the second cavity 110. The first and second cavities 109 and 110 in association with the substrate cavity 108 allow the membrane 101 to move in response to the sound waves entering via the acoustic holes 112 in the back-plate 104. In such instances the substrate cavity 108 is conventionally termed a "back volume", and it may be substantially sealed.

In other applications, the microphone may be arranged so that sound may be received via the substrate cavity 108 in use. In such applications the back-plate 104 is typically still provided with a plurality of holes to allow air to freely move between the second cavity and a further volume above the back-plate.

It should also be noted that whilst FIG. 1 shows the back-plate 104 being supported on the opposite side of the membrane to the substrate 105, arrangements are known where the back-plate 104 is formed closest to the substrate with the membrane layer 101 supported above it.

In use, in response to a sound wave corresponding to a pressure wave incident on the microphone, the membrane is deformed slightly from its equilibrium position. The distance between the lower electrode 102 and the upper electrode 103 is correspondingly altered, giving rise to a change in capacitance between the two electrodes that is subsequently detected by electronic circuitry (not shown). The bleed holes allow the pressure in the first and second cavities to equalise over a relatively long timescales (in acoustic frequency terms) which reduces the effect of low frequency pressure variations, e.g. arising from temperature variations and the like, but without impacting on sensitivity at the desired acoustic frequencies.

The transducer shown in FIG. 1 is illustrated with substantially vertical side walls supporting the membrane layer 101 in spaced relation from the back-plate 104. Given the nature of the deposition process this can lead to a high stress concentration at the corners formed in the material layer that forms the membrane. Sloped or slanted side walls may be used to reduce the stress concentration. Additionally or alternatively it is known to include a number of support structures such as columns to help support the membrane in a way which reduces stress concentration. Such columns are formed by patterning the first sacrificial material used to define the first cavity 109 such that the substrate 105 is exposed in a number of areas before depositing the material forming the membrane layer 101. However, this process can lead to dimples in the upper surface of the back-plate layer in the area of the columns.

MEMS transducers such as those shown in FIG. 1 may usefully be used in a range of devices, including portable devices. Especially when used for portable devices it is desirable that the MEMS transducers are sufficiently rugged to survive expected handling and use of the device. There is therefore a general desire to improve the resilience of MEMS devices.

Thus, to be useful for use in portable electronic devices such transducers should be able to survive the expected handling and use of the portable device, which may include the device being accidentally dropped.

If a device such as a mobile telephone is subject to a fall, this can result not only in a mechanical shock due to impact but also a high pressure impulse incident on a MEMS transducer. For example, a mobile telephone may have a sound/acoustic port for a MEMS microphone on one face of the device. If the device falls onto that face, some air may be compressed by the falling device and forced into the sound port. This may result in a high pressure impulse incident on the transducer. It has been found that in conventional MEMS transducers of the form described above high pressure impulses can potentially lead to damage of the transducer.

The sacrificial material used to define the first and second cavities is dimensioned so as to provide a desired equilibrium separation between the membrane layer 101 and the substrate 105 and also between the membrane layer 101 and the back-plate 104 so as to provide good sensitivity and dynamic range in use. In normal operation the membrane may deform within the volume defined by the first and second cavities without contacting the back-plate and/or substrate 105.

In response to a high pressure impulse however the membrane layer 101 may exhibit a greater amount of deformation than usual. FIG. 2a illustrates the situation where the membrane has been deformed downwards following a high pressure event and FIG. 2b shows the situation where the membrane has been displaced upwards.

Consider the situation where the microphone is arranged to receive incident sound from a sound port arranged above the back-plate 104 and the sound port pressure suddenly increases, for instance as a result of air trapped when the device falls being forced into the sound port. This may result the pressure in the second cavity 110 being significantly greater than the pressure in the first cavity 109, displacing the membrane downwards to greater extent than is usual.

This may result in a relatively large stress at point 301 where membrane layer 101 forms part of the sidewall of supporting structure 201 and, in some instances, may thus result in delamination of the membrane layer from the rest of the sidewall structure. Further, if the pressure difference is great enough the membrane may make contact with the substrate 105 at the edge of the substrate defined by the side wall 202 of the opening of substrate cavity 108. Typically the edge of the substrate at the location of the opening of substrate cavity has a relatively sharp angle and thus the membrane may be deformed round this edge, leading to a large stress concentration at this point 302.

As mentioned previously the membrane layer 101 will typically be formed from one or more thin layers of semiconductor material, such as silicon nitride. Whilst such a material can be flexible when subject to even stresses, if there is a significant localised out-of-plane stress, such as may be introduced into the membrane at point 302 by contact with the edge of the opening of substrate cavity 108, the membrane material can be relatively brittle. Thus contact between the membrane and the edge of the opening of substrate cavity in this way can lead to damage such as cracking of the membrane.

The bleed holes discussed above with relation to FIG. 1 will provide a flow path between the first and second cavities and thus flow of air through the bleed holes will reduce the pressure differential acting on the membrane over time. However the bleed holes are typically deliberately arranged to provide a limited amount of flow so as to provide a desired low frequency response. Thus a high pressure differential may be maintained across the membrane for a relatively long period of time before flow through the bleed holes acts to equalise the pressures in the first and second cavities. The time taken to equalise via the bleed holes could be changed by altering the size and/or number of bleed hole but this may impact negatively on transducer performance.

As the high pressure caused by trapped air may persist for a relatively long time, the pressure in the first and second cavities may equalise by virtue of the bleed holes as discussed. Thus the pressure in the first cavity, and substrate cavity, may increase until the pressures are equalized. However once air is no longer being forced into the sound port the pressure in the sound port will reduce quite quickly and, as typically the back-plate has a low acoustic impedance, the pressure in the second cavity will quickly reduce. At this point the pressure in the first cavity may be significantly greater than the pressure in the second cavity and thus the membrane may be deformed upwards, again to a greater extent than may usually be the case. Again this may lead to a significant stress in region 301 where the membrane layer 101 meets the sidewall of the supporting structure. If the pressure difference is large enough the membrane may be displaced far enough to contact the back-plate 104. This may limit the amount of travel of the membrane as compared with the situation shown in FIG. 2a but again this may introduce stress into the membrane layer at the point 303 where it contacts the back-plate 104. Again it may take a while for this pressure differential to reduce by virtue of flow through the bleed holes.

It should be appreciated that both of these situations can also occur when sound is received via the substrate cavity 108 but in the opposite order.

According to a previously proposed MEMS transducer, the transducer membrane is provided with a variable vent structure in the form of a moveable portion or "flap". The moveable flap portion is arranged such that its equilibrium position—i.e. the position it adopts with substantially no pressure differential acting on the moveable portion, is within the plane of the membrane. In response to a pressure differential across the moveable portion of the vent structure the moveable portion is deflected away from the plane of the membrane so as to expose a hole in the membrane. In this way, the size of a flow path through the vent structure between a first volume above the membrane to a second volume below the membrane is varied in response to a variable pressure differential acting on the moveable portion. Thus, the flap acts as a pressure relief valve and opens in order to provide a flow path through the membrane in response to a high pressure event, thereby tending to equalise the pressure above and below the membrane.

Such variable vent structures can thus be very useful in acting as a pressure-relief valve to protect the MEMS transducer from damage due to a pressure impulse. However, there is still a need to improve the robustness of MEMS transducers so that they stand a better chance of withstanding a shock or pressure impulse event.

Known transducers are typically provided with one or more mounting portions, or pillars, which tend to be provided in regions at or near the periphery of the membrane and which support the membrane layer in a fixed relation to the substrate. An event—such as a high pressure event—which causes the displacement of the membrane to a greater extent than usual—causes significant stresses at, or near, the mounting region(s) of the membrane.

Depending on the specific transducer design, it is often the case that the membrane is not supported around the entire periphery of the membrane. Rather, according to previously considered transducer designs, the membrane is supported in a fixed relation to the substrate along one or more so-called "supporting edges" of the membrane edge (also referred to as the "anchor point" in the art). Furthermore, one or more of the other edges of the membrane are unsupported and can therefore be considered to be "free" or "unbound" edges of the membrane. The unbound edges are able to move relative to the substrate as the flexible membrane deflects in response to an acoustic pressure differential across the membrane.

In the case of transducers which comprise at least one supporting edge and one or more unbound edges, displacement of the membrane causes the membrane to bend or fold along a bend axis that extends at or near the supporting edge of the membrane. The provision of a mounting structure, such as a plurality of mounting portions or pillars, along the supporting edge which serves to fix a portion of a peripheral edge of the membrane relative to the substrate, effectively defines a natural fold line along which the membrane will tend to fold or bend when the centre of the membrane is sufficiently displaced. If the membrane experiences a significant displacement, for example in response to a high pressure event, then the membrane will undergo a significant degree of bending along the natural fold line near the supporting edge. This results in stresses arising within the membrane layer and/or at the mounting structure that may lead to transducer damage, such as fracturing of the membrane at or near the fold line associated with the supporting edge.

SUMMARY

Embodiments of the present invention are generally concerned with alleviating and/or redistributing stresses within the membrane layer, for example in order to improve the resilience of MEMS devices to a pressure impulse incident on a MEMS transducer. In particular, embodiments of the present invention seek to alleviate membrane stresses arising in the region of the mounting structure and/or supporting edges of the membrane.

According to a first aspect of the present invention there is provided a MEMS transducer comprising a flexible membrane supported at a supporting edge relative to a substrate, the flexible membrane comprising a first unbound edge, wherein the first unbound edge traces a path from a first endpoint at, or near, a first end of the supporting edge,
wherein a first path segment is defined between first and second path points on the first unbound edge,
and wherein the first path segment traces a path which varies in distance from a straight line path between the first and second path points, the first path segment comprising at least two bendpoints at which the flexible membrane tends to bend in response to a given deflection of the flexible membrane.

Thus, the unbound edge can be considered to trace a path and the portion of the path between first and second path points is considered to be a path segment. Preferably, one of said first and second path points substantially coincides with said first endpoint of the unbound edge. Thus, the segment extends inwardly from the peripheral edge of the membrane. According to embodiments of the present invention, the path segment traces a path which varies in distance from the straight line path between the endpoints of the path segment. The straight line between the first and second path points may conveniently be considered to define a first axis or a "primary path direction". Thus, the path segment traces a path varies in distance in a direction orthogonal to the straight line path.

The first path segment preferably comprises at least two so-called "bendpoints" at which the flexible membrane is able to bend in the region or vicinity of the supporting edge. The plurality of bendpoints are points at which the flexible membrane will preferentially bend, or tend to bend, in response to a particular degree of deflection of the membrane. Preferably the given deflection of the membrane is greater than a threshold. Thus, the flexible membrane will preferably only tend to bend at the bendpoints in response to a pressure differential that is greater than a predetermined pressure differential.

When describing the path traced by the path segment of the unbound edge of the flexible membrane in a mathematical sense, the path segment may be considered to trace a path which includes one or more "stationary points"—i.e. a point at which the gradient of a tangent to the path is zero relative to the primary path direction (first axis). In particular, the path segment may trace a path which comprises a point—known as a "turning point"—at which the path direction changes sign from a positive direction to a negative direction with respect to the axis (second axis) orthogonal to the main path direction (first axis). Alternatively or additionally, the path segment may trace a path which comprises a point—known as an "undulation point"—at which the coordinate on the orthogonal axis goes to zero, i.e. the path segment crosses the first axis, but the path direction does not change sign.

A bendpoint is a point at which the flexible membrane will tend to bend in response to a particular pressure differential across the membrane. Preferably, the path segment of the flexible membrane comprises at least two preferential bendpoints. One bendpoint may be defined on a bend axis arising at or near the mounting portions which serve to support the flexible membrane in a fixed relation relative to the substrate. At least one further bendpoint is formed at a stationary point of the path segment which arises due to the shape of the path traced by the unbound edge in the region of the path segment.

According to embodiments of the present invention, the path segment may be considered to trace a path which is longer than the straight line path between the first and second path points. It will be appreciated that if the unbound edge traced a simple arcuate or curved path between the first and second path points, then the length of this path would be slightly longer than the straight line path. However, according to one embodiment of the present invention the path segment traces a path which is at least 10% longer and preferably at least 30% longer than the straight line path between the first and second path points.

Preferably, the MEMS transducer comprises a second unbound edge which traces a path from a first endpoint at, or near, a second end of the supporting edge, wherein a second path segment of the second unbound edge is defined between first and second path points on the second unbound edge, and wherein the second path segment traces a path which varies in distance from a straight line path between the first and second path points, the second path segment comprising one or more bendpoints at which the flexible membrane is able to bend in the region of the supporting edge.

A bendpoint of the first segment may be considered to correspond to a bendpoint of the second segment, wherein said corresponding bendpoints form a first pair of bendpoints. A bendpoint on the path segment of the first unbound edge comprises a first bendpoint and thus defines a first bend axis in conjunction with a corresponding bendpoint on the path segment S2 of the second unbound edge. Thus, bendpoints on respective first and second unbound edges can be considered to form a pair of bendpoints. The line intersecting a corresponding pair of bend points defines a bend axis along which the flexible membrane will tend to bend, or fold, in response to a certain membrane deflection.

The shape of the unbound edge is selected so that the flexible membrane tends to bend along more than one bend axis in the region of the supporting edge.

According to embodiment of the present invention, due to the shape of the path traced along a path segment, the flexible membrane is able to bend along at least two bend axes. This advantageously alleviates the stress that would otherwise arise in the vicinity of a single bend axis either within the membrane material itself, in particular in the region of the unbound edge or slit, or as a result of stress loading on the mount structures.

According to one embodiment, the path segment traces a path which comprises one or more curved sections. Alternatively, the path segment may trace a path which is formed of a plurality of substantially straight lines, or of a plurality of substantially straight lines with rounded corners. According to an embodiment the path segment traces a generally sinuous path, or a path resembling a triangular waveform wherein the stationary point preferably comprises a sudden or sharp change in direction.

The path segment is preferably defined in a region near the periphery of the flexible membrane. The path segment may extend at least partially over one of the side walls of the substrate. One of said path points defining the path segment may be located at or near one end of the supporting edge, and may substantially coincide with a first endpoint of the unbound edge.

According to a preferred embodiment, the shape of the path traced by a path segment is selected such that the flexible membrane does not bend significantly at a given bendpoint defined by a stationary points of the path segment during normal operating parameters of the transducer. Thus, the features associated with the present invention which serve to enhance the robustness of the transducer do not alter or undermine the transducer performance. For example, the path traced in the region of the path segment may trace a sinuous path to include at least one bendpoints, wherein the radius of curvature is selected such that the flexible membrane will not bend significantly at the bendpoint unless the membrane experiences a sufficient deflection—e.g. in response to a differential pressure which exceeds a selected threshold.

During deflection of the membrane—in particular during a significant deflection that takes place in response to a high pressure or shock event—the membrane will tend to fold in the vicinity of the supporting edge along more than one bend axis, each bend axis intersecting a bendpoint, or one of the stationary points, on the path segment. The ability of the membrane to bend or fold along more than one bend axis advantageously serves to redistribute the stress arising in the region of the supporting edge so that the stress load occurring along the bend axis closest to the supporting edge is reduced. Indeed, simulations have shown that the supporting structures or mounting portions provided along the supporting edge which serve to support the membrane in a fixed relation to the substrate, experience only a fraction of the stress caused by a larger than normal membrane displacement.

Thus, according to preferred embodiments of the present invention, the risk that the membrane will fracture at or near the supporting edge is advantageously mitigated by the provision of plural lines of bending.

The encouragement of bending at plural, generally parallel lines may beneficially discourage twisting of the membrane during an overload event. Such twisting—if it does arise—can give non-uniform displacements and stresses on (ideally) symmetric points of the structure with possible premature failure or damage.

According to another aspect of the present invention there is provided a MEMS transducer comprising a flexible membrane supported at a supporting edge relative to a substrate, the membrane comprising first and second unbound edges which each extend from an endpoint at, or near, first and second ends of the supporting edge respectively, wherein the first and second unbound edges each trace a path and wherein a path segment is defined between first and second path points on each of the unbound edges, each path segment comprising at least two bendpoints at which the flexible membrane is able to bend in the region of the supporting edge.

Depending on the design of the transducer, the membrane layer may be provided with one or more channels, or slits, which separate a first region of the membrane layer from one or more second regions of the membrane layer. The first region of the membrane forms the flexible membrane and comprises the region of the membrane layer that overlies a substrate cavity. Thus, the first region of the membrane may be considered to comprise the active region of the transducer membrane—i.e. the region of the membrane that is able to move in response to an acoustic stimulus and is therefore used for sensing and/or is "dynamic". An electrode may be coupled to the first/active region of the membrane. Furthermore, the second region of the membrane layer comprises the region of the membrane that at least partly overlies the sidewalls of the substrate and may be considered to comprise an "inactive region" of the membrane. The second/inactive region of the membrane, which is separated from the first/active region by a channel, can be considered to be non-dynamic in the sense that any movement of this part of the membrane is negligible.

It will be seen that the slit which separates the first and second regions of the membrane layer will define first and second adjacent edges that are complementary in shape. A first adjacent edge can be considered to form an unbound edge of the flexible membrane, and the second adjacent edge can be considered to form an edge of the second or inactive region of the membrane. Thus, it will be appreciated that the shape of an unbound edge may be determined by the shape of the slit which separates first and second regions of the membrane layer.

According to another aspect of the invention there is provided a MEMS transducer comprising a membrane having a first membrane region and a second membrane region, wherein the first membrane region is supported at a supporting edge relative to a substrate, the first membrane region being separated from the second membrane region by one or more slits, wherein the slit traces a path from an endpoint at or near the supporting edge, wherein a path segment is defined between said endpoint which forms a first path point and a second path point, wherein the path segment traces a non-linear path.

The slit can be considered to be shaped so as to define adjacent, interdigitated, edges. The slit can be considered to define adjacent, substantially complementary, edges.

The transducer may comprise a back-plate structure wherein the flexible membrane layer is supported with respect to said back-plate structure. The back-plate structure may comprise a plurality of holes through the back-plate structure.

The transducer may be a capacitive sensor such as a microphone. The transducer may comprise readout, i.e. amplification, circuitry. The transducer may be located within a package having a sound port, i.e. an acoustic port. The transducer may be implemented in an electronic device which may be at least one of: a portable device; a battery powered device; an audio device; a computing device; a communications device; a personal media player; a mobile telephone; a tablet device; a games device; and a voice controlled device.

Features of any given aspect may be combined with the features of any other aspect and the various features described herein may be implemented in any combination in a given embodiment.

Associated methods of fabricating a MEMS transducer are provided for each of the above aspects.

BRIEF DESCRIPTION OF THE DRAWINGS

For a better understanding of the present invention and to show how the same may be carried into effect, reference will now be made by way of example to the accompanying drawings in which.

DETAILED DESCRIPTION

Figure 1A:
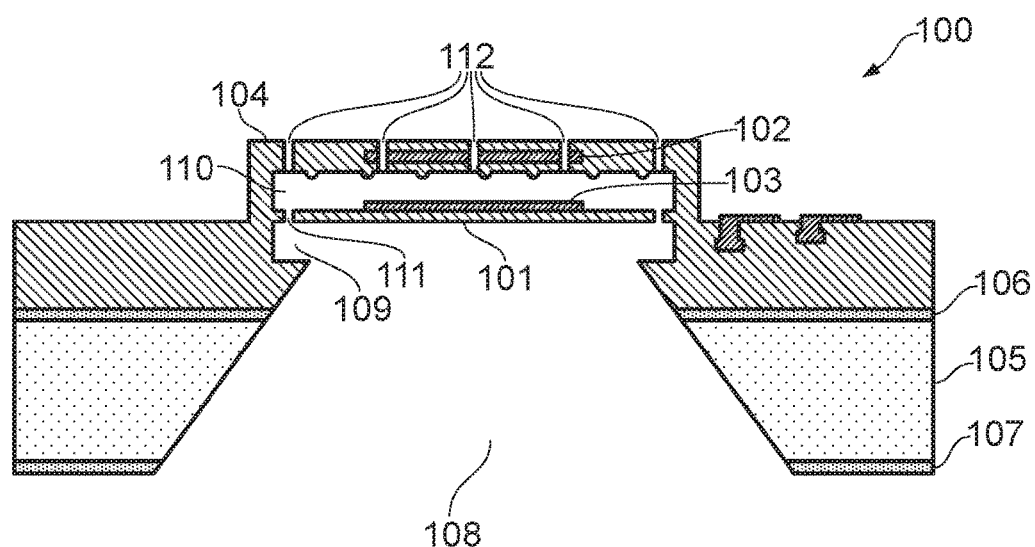
FIGS. 1a and 1b illustrate known capacitive MEMS transducers in section and cut-away perspective views.
Figure 1B:
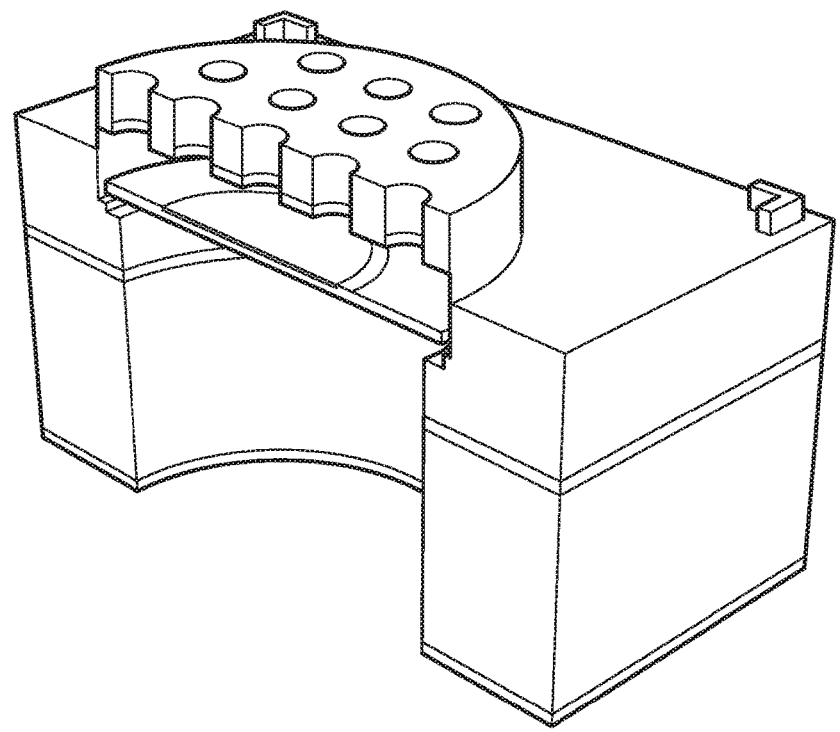
Figure 2A:
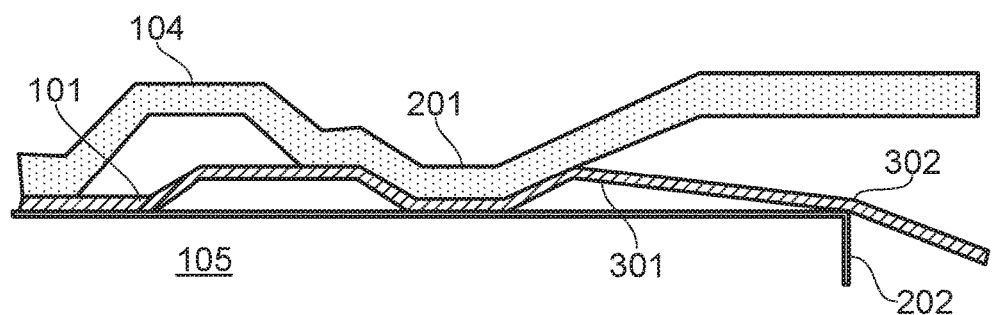
FIGS. 2a and 2b illustrate how a high pressure event may affect the membrane.
Figure 2B:
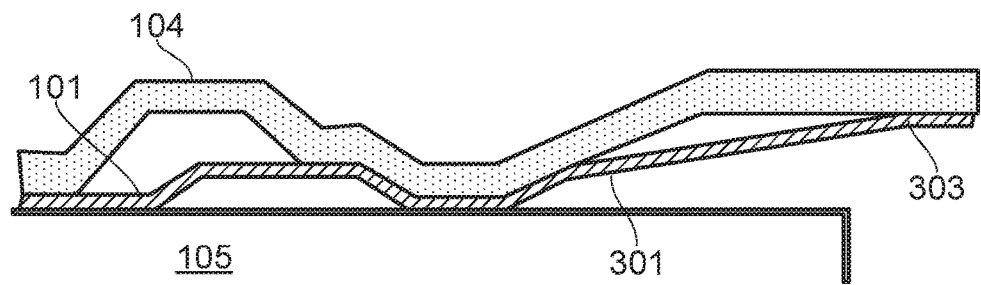

Throughout this description any features which are similar to features in other figures have been given the same reference numerals.

Embodiments of the present invention relate to MEMS transducers comprising a transducer structure comprising a flexible membrane supported between a first volume and a second volume. The first volume may for instance comprise the first cavity 109 between the membrane and the substrate and/or the volume formed in the substrate 108. The second volume may comprise the second cavity 110 between the membrane and back-plate and/or any volume in fluid communication with the second cavity (e.g. a sound port in top-port embodiments).

It will be appreciated that a material is said to be under stress when its atoms are displaced from their equilibrium positions due to the action of a force. Thus, a force that increases or decreases the interatomic distance between the atoms of the membrane layer gives rise to stress within the membrane. For example, the membrane layer exhibits an inherent, or intrinsic, residual stress when at equilibrium (i.e. when no or negligible differential pressure arises across the membrane). Furthermore, stresses can arise in the membrane layer e.g. due to the way in which the membrane is supported in a fixed relation to the substrate or due to an acoustic pressure wave incident on the membrane.

Figure 3:
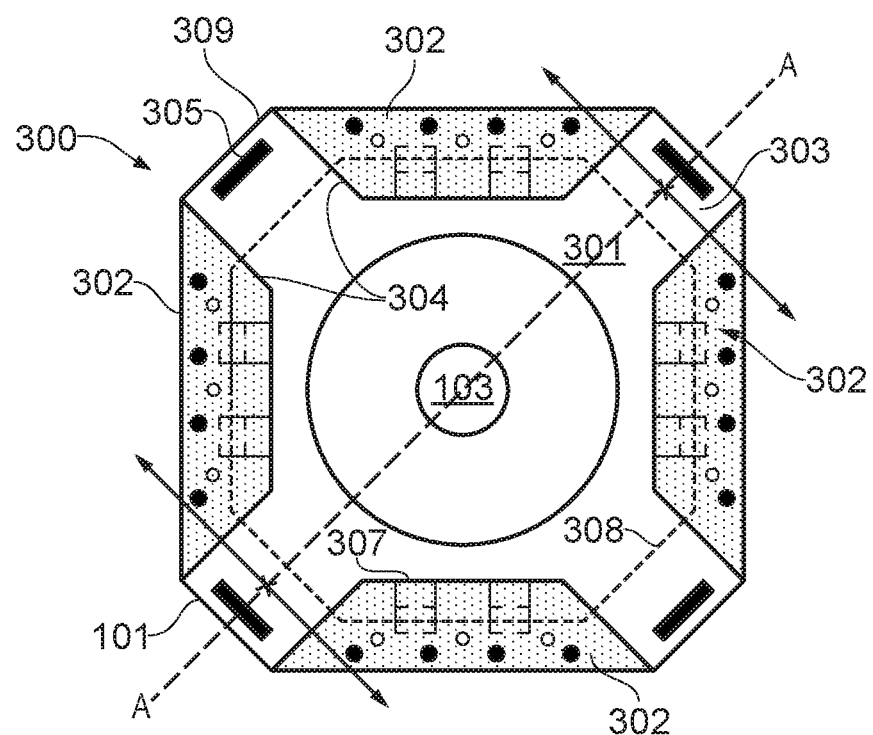
FIG. 3 illustrates a previously considered transducer structure.

FIG. 3 illustrates an example of a previously considered transducer 300. The whole area illustrated in FIG. 3 is provided with a layer of membrane material. The layer of membrane material is divided by means of channels or slits 304 into a first membrane region 301 illustrated by the unshaded region and a plurality of second regions 302 illustrated by the shaded portions. The first membrane region 301 forms the flexible membrane of the transducer and the second regions form so-called "inactive" membrane regions. A membrane electrode 103 is located in a central region of the flexible membrane. The outline of the underlying substrate cavity is indicated by the dashed line 308.

The channels or slits 304 which separate the material of the active, flexible, membrane 301 and the inactive membrane regions 302, thus form one or more unbound edges i.e. edges that are not supported in a fixed relation relative to the substrate. Conveniently during manufacture a continuous layer of membrane material may be deposited and then the channels 304 may be etched through the membrane material to form the first and second regions.

The flexible membrane is supported by means of mount structures 305 in a fixed relation relative to the substrate. The mount structures are provided in the vicinity of a supporting edge 309 of the flexible membrane. In this example, the transducer comprises four supporting edges—each supporting edge being formed along the peripheral edge of each of four "membrane arms" which project from a central region of the flexible membrane. It will be appreciated that embodiments of the present invention extend to any transducer design in which one or more membrane edges are unbound and disposed in relation to an adjacent supporting edge/point.

The mount structures of a supporting edge may take various forms. For instance the mount could comprise a sidewall of the transducer structure and the membrane layer may extend into the sidewall. In some examples however the mount may be a region where the membrane material makes contact with the substrate or a support structure that rises from the substrate. The mount may also comprise an area where a support structure for the backplate makes contact with the membrane. The membrane at the mount is thus effectively held in place and prevented from any substantial movement with respect to the substrate and/or backplate.

Embodiments of the present invention seek to alleviate stresses arising in the region of the mounting portion(s) and/or supporting edges of the membrane. With reference to FIG. 3 it will be appreciated that stresses arise within the transducer structure for various reasons. For example, stress arises within the membrane and the mounting portions as the membrane folds or bends relative to the mounting portions. Stress also arises in the membrane material in the region of an unbound/free edge of the flexible membrane, in particular near an endpoint of the free edge where the free edge intersects the periphery of the membrane layer and/or the supporting edge of the membrane. This is sometimes referred to as "slit termination stress" since it occurs in the vicinity of the termination of the slit that separates the flexible membrane from the rest of the deposited membrane layer.

Figure 4:
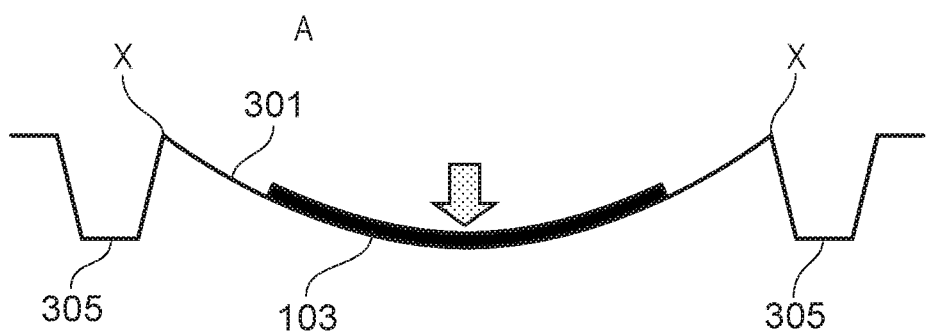
FIG. 4 illustrates a simplified section through the line A-A shown in FIG. 3.

There is a risk that stresses arising within the transducer as a result of a shock or high pressure event may exceed the yield threshold of the membrane and/or pillars, resulting in damage to the transducer structure. This is illustrated in FIG. 4, which illustrates a cross-section through the line A-A of FIG. 3. Thus, a high pressure event for example may result in the membrane breaking along the natural fold line X that occurs at or near supporting edge 309 as stress loading exceeds the safe limit of the membrane material. In the case of a membrane formed of a Nitride material, such as silicon Nitride, the yield point is around 5 to 7 GPa.

Figure 5:
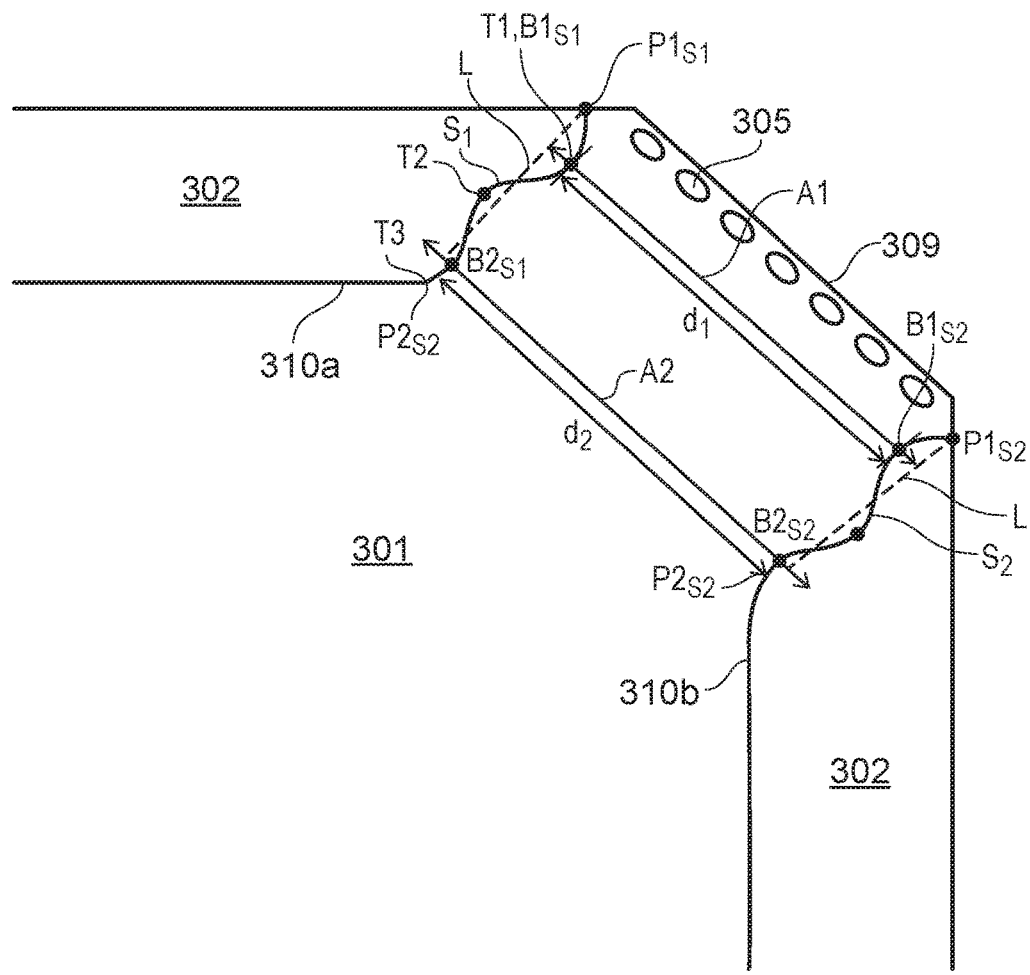
FIG. 5 illustrates a part of a transducer structure according to a first example of the present invention.

FIG. 5 illustrates a part of a transducer structure according to a first example of the present invention. The transducer structure comprises a first supporting edge 309 at which the flexible membrane is supported in a fixed relation to the substrate (not shown) by means of an array of pillars 305 which form the mount structure in this example. The transducer also comprises first and second unbound edges 310*a* and 310*b* which are defined by slits which extend through the membrane material so as to divide the deposited membrane layer into the first region forming the flexible membrane 301 and second regions 302. The first and second unbound edges 310*a*, 310*b* each extend from an endpoint at, or near, first and second ends of the supporting edge respectively.

Each of the unbound edges can be considered to trace a path. In the context of the present invention we are particularly concerned with the shape of that path in the vicinity of the associated supporting edge. Thus, a path segment S is defined between first and second path points P1, P2 on each of the unbound edges. In this case, the first path point P1 of each path segment S terminates at a peripheral edge of the membrane at one end of the supporting edge 309.

The first and second path segments S1, S2 are each provided with two bendpoints B1, B2. Each bendpoint represents a point or region at which the flexible membrane will tend to bend e.g. as a result of a sufficient deflection of the membrane. In this example, the first and second path segments S1, S2 are each provided with three stationary points T1, T2, T3.

A bend point on the path segment S1 of the first unbound edge 310*a* comprises a first bendpoint ($B1_{s1}$) and defines a first bend axis with a corresponding bendpoint ($B1_{s2}$) on the path segment S2 of the second unbound edge 310*b*. Thus, bendpoints $B1_{s1}$ and $B1_{s2}$ on respective first and second unbound edges form a pair of bendpoints. The line intersecting a corresponding pair of bend points defines a bend axis along which the flexible membrane will tend to bend, or fold, in response to a certain membrane deflection.

The Example shown in FIG. 5 comprises two bend axes A1 and A2. As shown in this example, the distance between pairs of bendpoints is substantially equal. Thus, in this example distance d1 is substantially equal to d2.

Thus, according to the embodiment shown in FIG. 5, the MEMS transducer comprises a plurality of bend axes spaced sequentially from the supporting edge of the membrane. Simulations of embodiments of the present invention have demonstrated that peak stress values arising in the vicinity of the supporting edge are reduced as the stress loading is effectively shared between the plurality of bend axes. As a result the risk of membrane fracture or damage to the underlying mount structures are mitigated.

The precise shape of the path traced by the path segment can be determined such that the flexible membrane does not bend at a given bendpoint during normal operating parameters of the transducer. Furthermore, the path traced by the path segments may be shared such that two or more of the plurality of bend axes come into play—for example in response to a high pressure event—either simultaneously or sequentially.

Figure 6:
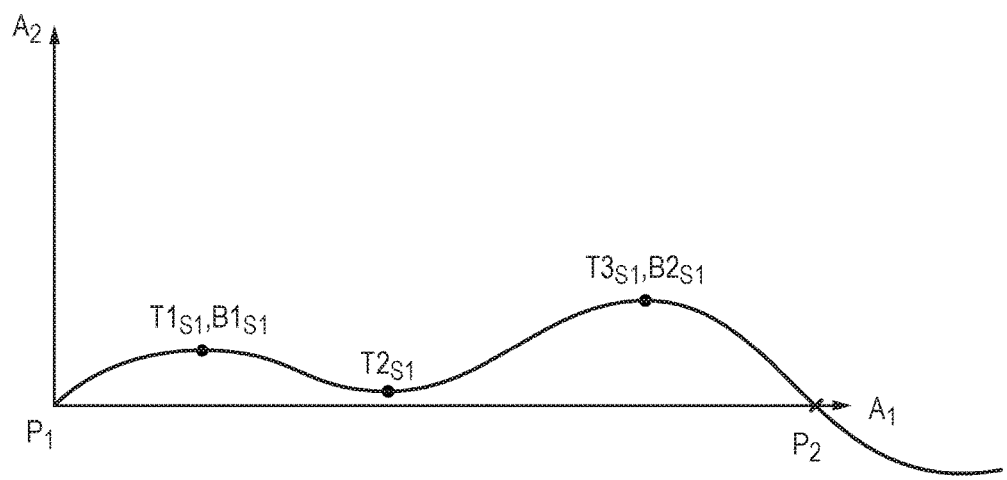
FIG. 6 illustrates the path traced by an unbound edge of the transducer structure shown in FIG. 5.

FIG. 6 illustrates the path traced by the unbound edge 310*a* between the first and second path points P1 and P2 defining path segment S1. It is convenient to plot the path with reference to a first axis A1 that is defined along the straight line path L between path points P1 and P2 and a second axis orthogonal to the first axis.

The path comprises three stationary points T1, T2 and T3 all of which are so-called "turning points"—i.e. points at which the path direction changes sign from a positive direction to a negative direction with respect to the axis orthogonal to the main path direction. Thus, it can be seen that the first differential of a line tangential to the path—i.e. the gradient—will be zero relative to the main (primary) path direction (first axis) at these points. Alternatively or additionally, the path segment may trace a path which comprises a point known as an "undulation point"—at which the coordinate in the orthogonal axis (second axis) goes to zero, i.e. the path segment crosses the first axis, but the path direction does not change sign.

Whilst the example embodiment shown in FIG. 5 includes the provision of two bend points on a given path segment, the present invention encompasses embodiments in which a path segment comprises three or more bend points. Similarly, embodiments comprising a pair of unbound edges, and thus a corresponding pair of path segments, are envisaged which comprise three or more bend axes.

Figure 7:
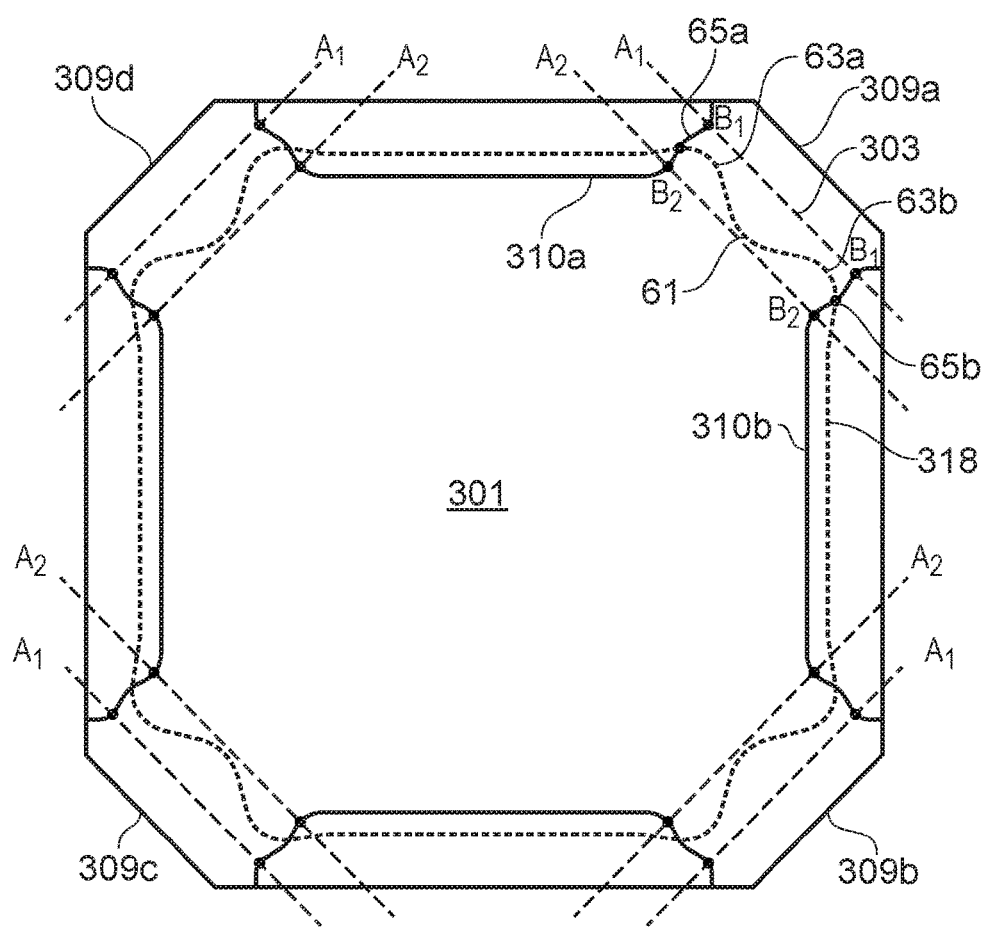
FIG. 7 shows a transducer structure according to another example of the present invention.

According to another aspect as illustrated in FIG. 7, a peripheral edge of the substrate cavity which is shown by the dotted line 318 defines at least one curved path that is convex with reference to the centre of the cavity. The peripheral edge of the cavity further defines at least one curved path that is concave with reference to the centre of the cavity.

Further details of this aspect, and the advantages thereof, can be found in greater detail in co-pending application P3086 being concurrently filed by the present Applicant.

In the co-pending application, there is defined a MEMS transducer structure comprising: a substrate, the substrate comprising a cavity; a membrane layer supported relative to the substrate to provide a flexible membrane; wherein a peripheral edge of the cavity defines at least one perimeter region that is convex with reference to the center of the cavity. The peripheral edge of the cavity may further define at least one perimeter region that is concave with reference to the center of the cavity. A convex portion is preferably positioned around the periphery of the cavity such that, upon deflection of the flexible membrane during use towards the cavity, the flexible membrane makes contact with the convex portion of the peripheral edge of the cavity prior to another portion of the peripheral edge of the cavity.

The co-pending application defines a MEMS transducer structure comprising:

a substrate, the substrate comprising a cavity;
a membrane layer supported relative to the substrate to provide a flexible membrane, wherein the membrane layer comprises an active central region and a plurality of support arms (303) which extend laterally from the active central region for supporting the active central region of the membrane;

wherein a peripheral edge of the cavity defines at least first and second perimeter regions that are concave with reference to the center of the cavity.

The membrane layer is supported relative to the substrate to provide a flexible membrane. In this example the membrane comprises an active central region 301 and a plurality of support arms 303 which extend laterally from the active central region for supporting the active central region of the membrane. A peripheral edge 318 of the cavity defines at least one curved path 61 that is convex with reference to the center of the cavity. The peripheral edge 318 of the cavity defines first and second concave portions 63a, 63b corresponding to each support arm 303, whereby the first and second concave portions 63a, 63b are positioned around the periphery of the cavity such that they underlie corresponding first and second edges 65a, 65b of a support arm 303. The first and second concave portions 63a, 63b are positioned around the periphery of the cavity such that, upon deflection of the flexible membrane during use towards the cavity, first and second edges 65a, 65b of a supporting arm 303 of the flexible membrane make contact with the concave portions 63a, 63b on the peripheral edge of the cavity later than a center region of the supporting arm 303.

Furthermore, the embodiment of FIG. 7 comprises support arms 303 in which unbound edge portions 65a, 65b of a support arm (303) comprises one or more bendpoints, for example an S-shaped curve. The one or more bendpoints or S-shaped curve (65a, 65b) on the membrane overlie a concave portion (63a, 63b) on a peripheral edge of the cavity. The bendpoints on respective first and second unbound edges form a pair of bendpoints. The line intersecting a corresponding pair of bend points defines a bend axis along which the flexible membrane will tend to bend, or fold, in response to a certain membrane deflection.

It should be understood that the term upper should not be in any way construed as limiting to any particular orientation of the transducer during any fabrication step and/or its orientation in any package, or indeed the orientation of the package in any apparatus. The relative terms lower, above, below, underside, underneath etc. shall be construed accordingly.

It should also be noted that the terms front and back-volume do not denote any particular type of transducer construction or orientation of the transducer. In particular for a MEMS capacitive transducer having a flexible membrane, the flexible membrane will typically support a first electrode relative to a second, substantially fixed, electrode. The second electrode may be supported by a support structure, which is separated from the flexible membrane by a transducer cavity or gap. The support structure supporting the second electrode is sometimes referred to as a back-plate and is typically designed to have a relatively low acoustic impedance at the frequencies of interest. In some designs of transducer the back-plate may be located above the membrane (when fabricated on the substrate) and thus the cavity 205 in the substrate extends beneath the membrane. In other designs however a back-plate may be located under the membrane and the cavity 205 in the die substrate may therefore extend through the die substrate to the membrane. Such a support structure, or back-plate, may therefore be located in the front volume or in the back volume.

The cavity 205 in the substrate may be formed in any known way. Advantageously the cavity may have a cross sectional area that increases towards the lower side of the substrate Thus the cavity immediately underlying the transducer may have a first cross sectional area so that the area of the membrane is defined accurately. Towards the lower side of the die substrate the cross sectional area of the cavity may be larger so as to maximise the part of the back volume provided by the cavity. In some embodiments there may be a step change in the slope profile of the walls of the cavity. Such a cavity profile may be achieved by a multi-stage etching process such as described in the patent GB2451909.

In some examples the membrane is generally square or rectangular in shape, and wherein an active centre region of the membrane is under intrinsic stress.

In the embodiments described herein, a cross-section of the periphery of the cavity lies in a plane parallel to the surface of the substrate.

A MEMS transducer according to the embodiments described here may comprise a capacitive sensor, for example a microphone.

A MEMS transducer according to the embodiments described here may further comprise readout circuitry, for example wherein the readout circuitry may comprise analogue and/or digital circuitry.

A MEMS transducer according to the embodiments described here may be located within a package having a sound port.

According to another aspect, there is provided an electronic device comprising a MEMS transducer according to any of the embodiments described herein. An electronic device may comprise, for example, at least one of: a portable device; a battery powered device; an audio device; a computing device; a communications device; a personal media player; a mobile telephone; a games device; and a voice controlled device.

One or more transducers according to the any of the embodiments described above may be incorporated in a package.

According to another aspect, there is provided an integrated circuit comprising a MEMS transducer as described in any of the embodiments herein.

According to another aspect, there is provided a method of fabricating a MEMS transducer as described in any of the embodiments herein.

Although the various embodiments describe a MEMS capacitive microphone, the invention is also applicable to any form of MEMS transducers other than microphones, for example pressure sensors or ultrasonic transmitters/receivers.

Embodiments of the invention may be usefully implemented in a range of different material systems, however the embodiments described herein are particularly advantageous for MEMS transducers having membrane layers comprising silicon nitride.

The MEMS transducer may be formed on a transducer die and may in some instances be integrated with at least some electronics for operation of the transducer.

In the embodiments described above it is noted that references to a transducer element may comprise various forms of transducer element. For example, a transducer element may comprise a single membrane and back-plate combination. In another example a transducer element comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprises different individual transducers positioned to receive acoustic signals from different acoustic channels.

It is noted that in the embodiments described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. However, it is noted that the embodiments are also intended to embrace the output signal being derived by monitoring piezo-resistive or piezo-electric elements or indeed a light source. The embodiments are also intended to embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It is noted that the embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, wearable devices, laptops, mobile phones, PDAs and personal computers. Embodiments may also be used in voice activated or voice controlled devices. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer comprising a flexible membrane supported at a plurality of supporting edges relative to a substrate, the flexible membrane comprising an active central region and a plurality of supporting arms, each supporting arm extending laterally from the central region, wherein each supporting arm comprises a first unbound edge portion which traces a path from a first endpoint of the first unbound edge at, or near, a first end of the supporting edge,
wherein a first path segment is defined between first and second path points on the first unbound edge portion of one said supporting arm,
and wherein the first path segment traces a path which varies in distance from a straight line path between the first and second path points, the first path segment comprising at least two bendpoints at which the flexible membrane tends to bend in response to a given deflection of the flexible membrane.

2. A MEMS transducer as claimed in claim 1, comprising a second unbound edge portion which traces a path from a first endpoint of the second unbound edge at, or near, a second end of the supporting edge,
wherein a second path segment of the second unbound edge is defined between first and second path points on the second unbound edge portion,
and wherein the second path segment traces a path which varies in distance from a straight line path between the first and second path points, the second path segment comprising one or more bendpoints at which the flexible membrane tends to bend in response to a given deflection of the flexible membrane.

3. A MEMS transducer as claimed in claim 2, wherein a bendpoint of the first segment corresponds to a bendpoint of the second segment, said corresponding bendpoints forming a pair of bendpoints.

4. A MEMS transducer as claimed in claim 3, wherein a line intersecting the pair of bendpoints defines a bend axis of the flexible membrane.

5. A MEMS transducer as claimed in claim 4, wherein the flexible membrane comprises a plurality of bend axes in a peripheral region of the membrane at, or near, the supporting edge.

6. A MEMS transducer as claimed in claim 5, wherein the bend axes are substantially parallel to each other and wherein a first bend axis extends along, or substantially parallel to, the supporting edge.

7. A MEMS transducer as claimed in claim 5, wherein the distance between a first pair of bendpoints defining a first bend axis is substantially equal to the distance between another pair of bendpoints defining another bend axis.

8. A MEMS transducer as claimed in claim 1, wherein at least one of the bendpoints forms a stationary point on the path traced by the path segment.

9. A MEMS transducer as claimed in claim 8, wherein the, or one of the, stationary point(s) comprises a turning point.

10. A MEMS transducer as claimed in claim 8, wherein the, or one of the, stationary point(s) comprises an undulation point.

11. A MEMS transducer as claimed in claim 1, wherein the, or each, path segment traces a path which is at least 10% longer than the straight line path between associated first and second path points.

12. A MEMS transducer as claimed in claim 1, wherein the, or each, path segment traces a path which comprises one or more curved sections.

13. A MEMS transducer as claimed in claim 1, wherein the, or each, path segment is provided in a region at the periphery of the flexible membrane.

14. A MEMS transducer as claimed in claim 1, wherein one of said first and second path points substantially coincides with the endpoint of the associated unbound edge.

15. A MEMS transducer comprising a flexible membrane supported at a supporting edge relative to a substrate,
the membrane comprising first and second unbound edges which each extend from an endpoint at, or near, first and second ends of the supporting edge respectively, a path segment being defined between first and second path points on each of the unbound edges, each path segment comprising at least two bendpoints at which the flexible membrane tends to bend in response to a given deflection of the flexible membrane, wherein a bendpoint of the first segment corresponds to a bendpoint of the second segment, said corresponding bendpoints forming a pair of bendpoints and wherein a line intersecting the pair of bendpoints defines a bend axis of the flexible membrane, wherein a first bend axis is substantially parallel to a second bend axis and also to the supporting edge.

16. A MEMS transducer comprising a membrane having a first membrane region and a second membrane region, wherein the first membrane region is supported at a supporting edge relative to a substrate and comprises an active central region and a plurality of supporting arms, each supporting arm extending laterally from the central region, the first membrane region being separated from the second membrane region by one or more slits, a given slit providing an unbound edge portion of the support arm, wherein the unbound edge portion traces a path from an endpoint at or near the supporting edge, wherein a path segment is defined between said endpoint which forms a first path point and a second path point, wherein the path segment traces a non-linear path.

17. A MEMS transducer as claimed in claim 1 comprising a back-plate structure wherein the flexible membrane is supported with respect to said back-plate structure.

18. A MEMS transducer as claimed in claim 17 wherein said back-plate structure comprises a plurality of holes through the back-plate structure.

19. A MEMS transducer as claimed in claim 1, wherein the flexible membrane comprises a vent structure, the vent structure comprising a moveable portion which, in response to a differential pressure across the vent structure, deflects to reveal a flow path through the membrane.

20. A MEMS transducer as claimed in claim 1 wherein said transducer comprises a capacitive microphone.

21. An electronic device comprising a MEMS transducer as claimed in claim 1,
   wherein said device is at least one of: a portable device; a battery powered device; an audio device; a computing device; a communications device; a personal media player; a mobile telephone; a games device; and a voice controlled device.

* * * * *